United States Patent
Fu et al.

(10) Patent No.: US 8,564,063 B2
(45) Date of Patent: Oct. 22, 2013

(54) SEMICONDUCTOR DEVICE HAVING METAL GATE AND MANUFACTURING METHOD THEREOF

(75) Inventors: Ssu-I Fu, Kaohsiung County (TW); I-Ming Tseng, Kaohsiung County (TW); En-Chiuan Liou, Tainan County (TW); Cheng-Guo Chen, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 248 days.

(21) Appl. No.: 12/962,624

(22) Filed: Dec. 7, 2010

(65) Prior Publication Data

US 2012/0139042 A1 Jun. 7, 2012

(51) Int. Cl.
*H01L 29/78* (2006.01)

(52) U.S. Cl.
USPC ..... 257/344; 257/410; 257/412; 257/E29.135

(58) Field of Classification Search
USPC .................................................. 257/E29.135
See application file for complete search history.

(56) References Cited

U.S. PATENT DOCUMENTS

| | | | |
|---|---|---|---|
| 5,298,435 A | 3/1994 | Aronowitz et al. | |
| 5,399,506 A | 3/1995 | Tsukamoto | |
| 5,595,919 A | 1/1997 | Pan | |
| 5,780,350 A | 7/1998 | Kapoor | |
| 5,885,861 A | 3/1999 | Gardner | |
| 5,937,325 A | 8/1999 | Ishida | |
| 5,959,333 A | 9/1999 | Gardner | |
| 6,037,238 A | 3/2000 | Chang et al. | |
| 6,077,751 A | 6/2000 | Marcus | |
| 6,100,171 A | 8/2000 | Ishida | |
| 6,127,211 A | 10/2000 | Hirao | |
| 6,165,846 A | 12/2000 | Carns | |
| 6,200,836 B1 | 3/2001 | Yoo | |
| 6,214,682 B1 | 4/2001 | Wang | |
| 6,245,689 B1 | 6/2001 | Hao | |
| 6,274,447 B1 | 8/2001 | Takasou | |
| 6,284,609 B1 | 9/2001 | Ang | |
| 6,358,826 B1 | 3/2002 | Hause et al. | |
| 6,365,476 B1 | 4/2002 | Talwar | |
| 6,387,762 B2 | 5/2002 | Takasu | |
| 6,451,675 B1 | 9/2002 | Yeh | |
| 6,475,885 B1 | 11/2002 | Sultan | |
| 6,509,234 B1 * | 1/2003 | Krivokapic | 438/270 |
| 6,544,822 B2 | 4/2003 | Kim | |
| 6,605,498 B1 | 8/2003 | Murthy | |
| 6,642,122 B1 | 11/2003 | Yu | |
| 6,682,980 B2 | 1/2004 | Chidambaram | |
| 6,808,997 B2 | 10/2004 | Jain | |
| 6,943,085 B2 | 9/2005 | Wang | |

(Continued)

*Primary Examiner* — Stephen W Smoot
(74) *Attorney, Agent, or Firm* — Winston Hsu; Scott Margo (57) ABSTRACT

A method of manufacturing a semiconductor device having metal gate includes providing a substrate having at least a dummy gate, a sacrificial layer covering sidewalls of the dummy gate and a dielectric layer exposing a top of the dummy gate formed thereon, forming a sacrificial layer covering sidewalls of the dummy gate on the substrate, forming a dielectric layer exposing a top of the dummy gate on the substrate, performing a first etching process to remove a portion of the sacrificial layer surrounding the top of the dummy gate to form at least a first recess, and performing a second etching process to remove the dummy gate to form a second recess. The first recess and the second recess construct a T-shaped gate trench.

7 Claims, 8 Drawing Sheets

(56) References Cited

U.S. PATENT DOCUMENTS

| | | |
|---|---|---|
| 7,112,495 B2 | 9/2006 | Ko |
| 7,176,090 B2 | 2/2007 | Brask |
| 7,205,616 B2 | 4/2007 | Momiyama |
| 2002/0142549 A1* | 10/2002 | Miwa .......................... 438/296 |
| 2004/0121554 A1 | 6/2004 | Ohnishi |
| 2005/0116290 A1 | 6/2005 | de Souza |
| 2005/0142719 A1 | 6/2005 | Lee |
| 2006/0154429 A1 | 7/2006 | de Souza et al. |
| 2006/0172473 A1 | 8/2006 | Cheng et al. |
| 2007/0037373 A1 | 2/2007 | Hsiao |
| 2007/0148888 A1 | 6/2007 | Krull |
| 2007/0169696 A1 | 7/2007 | Olsen |
| 2007/0196990 A1 | 8/2007 | Hsiao |
| 2007/0238234 A1 | 10/2007 | Wang |
| 2007/0243688 A1 | 10/2007 | Liao |
| 2007/0298557 A1 | 12/2007 | Nieh |
| 2008/0265322 A1* | 10/2008 | Lin et al. ...................... 257/347 |
| 2009/0224338 A1* | 9/2009 | Nagaoka ....................... 257/410 |
| 2012/0244669 A1 | 9/2012 | Liao |

* cited by examiner

SEMICONDUCTOR DEVICE HAVING METAL GATE AND MANUFACTURING METHOD THEREOF

BACKGROUND OF THE INVENTION

1. Field of the Invention

The invention relates to a semiconductor device having a metal gate and manufacturing method thereof, and more particularly, to a semiconductor device having a metal gate and manufacturing method applied with a gate last process.

2. Description of the Prior Art

With a trend toward scaling down the size of the semiconductor device, work function metals are used to replace the conventional polysilicon gate to be the control electrode that competent to the high-K gate dielectric layer. The conventional dual metal gate methods are categorized into the gate first process and the gate last process. Among the two main approaches, the gate last process is able to avoid processes of high thermal budget and to provide wider material choices for the high-K gate dielectric layer and the metal gate, and thus gradually replaces the gate first process.

In a conventional gate last process, a dummy gate or a replacement gate is formed on a substrate and followed by steps of forming a conventional metal-oxide semiconductor (MOS) transistor device and forming an inter-layer dielectric (ILD) layer. Subsequently, the dummy/replacement gate is removed to form a gate trench. And the gate trench is filled with metal layers required for different conductivity types. As the line width of the transistor device keeps shrinking, the aspect ratio of the gate trench becomes more and more critical when filling the gate trench with the metal layers. Briefly speaking, when the line width of the transistor device is reduced, the opening width of the gate trench is consequently reduced, and thus it is difficult to fill the gate trench with the metals, it even causes a seam left in the metal gate after forming the metal layers in the gate trench. Eventually, the electrical performance of the transistor device having the metal gate is deteriorated.

It is found that the gate last process is able to avoid processes of high thermal budget and to provide wider material choices for the high-K gate dielectric layer and the metal gate. However, the gate last process still faces integrity requirements for the complicated processes and reliability requirement for the gate trench filling.

SUMMARY OF THE INVENTION

According to a first aspect of the present invention, there is provided a method of manufacturing a semiconductor device having metal gate. The method includes providing a substrate having at least a dummy gate, a sacrificial layer covering sidewalls of the dummy gate and a dielectric layer exposing a top of the dummy gate formed thereon, performing a first etching process to remove a portion of the sacrificial layer surrounding the top of the dummy gate to form at least a first recess, and performing a second etching process to remove the dummy gate to form a second recess, the first recess and the second recess constructing a T-shaped gate trench.

According to a second aspect of the present invention, there is provided a semiconductor device having metal gate. The semiconductor device includes a substrate, a high-K gate dielectric layer, a T-shaped metal gate, a source/drain positioned in the substrate at two sides of the T-shaped metal gate, and a sacrificial layer formed at two sides of the T-shaped metal gate. The T-shaped metal gate includes a head portion and a body portion formed under the head portion for supporting the head portion. The sacrificial layer at least is formed under the head portion of the T-shaped metal gate.

According to the semiconductor device having a metal gate and the method of manufacturing a semiconductor device having metal gate provided by the present invention, the T-shaped gate trench constructed by the first recess and the second recess is obtained by performing two etching processes. According to the present invention, the T-shaped gate trench includes a larger opening width, thus the metal layers are easily formed in the trench gate. Consequently, the semiconductor device having metal gate provided by the present invention has the advantage of superior gap-filling result and improved reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method of manufacturing a semiconductor device having metal gate provided by a first preferred embodiment of the present invention; wherein

DETAILED DESCRIPTION

Figure 1:
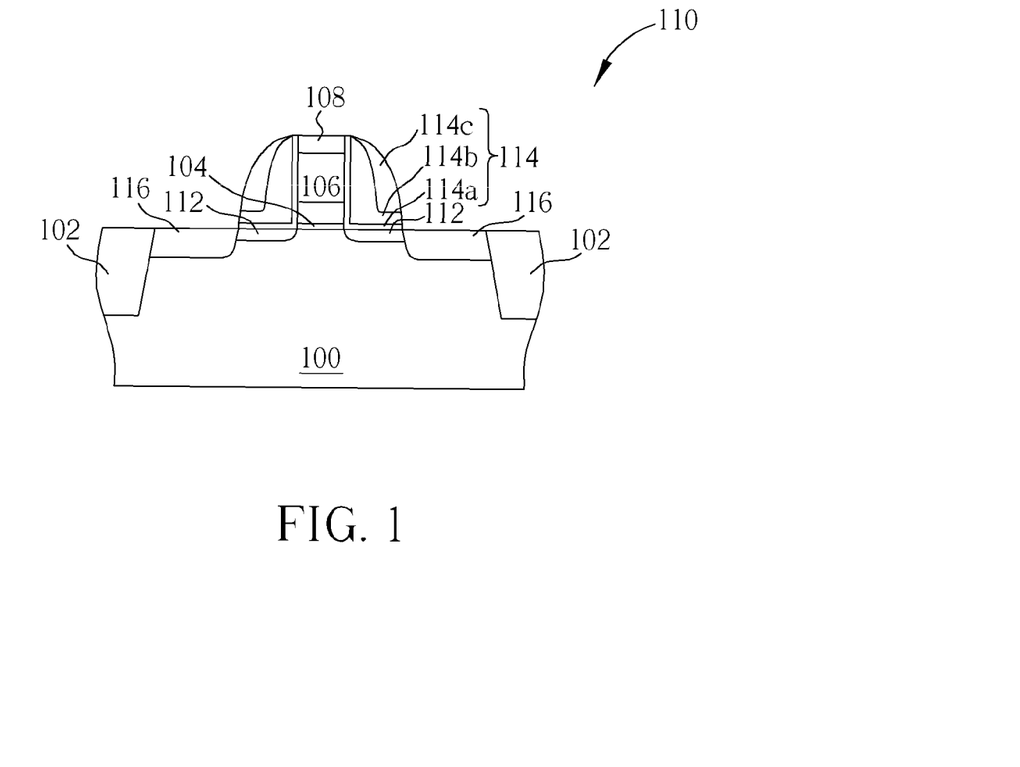

Please refer to FIGS. 1-8, which are schematic drawings illustrating a method of manufacturing a semiconductor device having metal gate provided by a first preferred embodiment of the present invention. As shown in FIG. 1, a substrate 100 such as a silicon substrate, a silicon-containing substrate, or a silicon-on-insulator (SOI) substrate is provided. A plurality of shallow trench isolation (STI) 102 is formed in the substrate 100 for providing electrical isolation. Subsequently, at least a semiconductor device 110 is formed on the substrate 100. The semiconductor device 110 includes a gate dielectric layer 104, a dummy gate 106 such as a polysilicon layer, and a patterned hard mask 108. The gate dielectric layer 104 can be a conventional SiO layer or a high-K gate dielectric layer. It is noteworthy that when a high-K first process is integrated into the preferred embodiment, the gate dielectric layer 104 includes a high-K gate dielectric layer, and the high-K gate dielectric layer is selected from the group consisting of silicon oxide ($SiO_2$), silicon nitride ($Si_3N_4$), silicon oxynitride (SiON) and metal oxide. And the metal oxide comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), or hafnium zirconium oxide ($HfZrO_4$).

Please still refer to FIG. 1. After forming the dummy gate 106, light-doped drains (LDDs) 112 are formed in the substrate 100 at two sides of the dummy gate 106 and followed by forming a spacer 114 on sidewalls of the dummy gate 106. The spacer 114 preferably is a multi-layered structured that outwardly includes a silicon nitride (SiN) seal layer 114a, a silicon oxide (SiO) layer 114b and a SiN layer 114c formed by hexachlorodisilane (Si$_2$Cl$_6$) (HCD-SiN). After forming the spacer 114, a source/drain 116 is formed in the substrate 100 at two sides of the spacer 114. In the preferred embodiment, selective epitaxial growth (SEG) method can be utilized to form the source/drain 116. For example, when the semiconductor device 110 is a P-type transistor, epitaxial silicon layers of SiGe are used to form the source/drain 116; and when the semiconductor device 110 is an n-type transistor, epitaxial silicon layers of SiC are used to form the source/drain 116. Thereafter, salicides (not shown) for reducing contact resistance are formed on the source/drain 116. Since the steps of forming the dummy gate 106, the LDDs 112, the spacer 114 and the source/drain 116 are well-known to those skilled in the art, the details are omitted herein in the interest of brevity.

Figure 2:
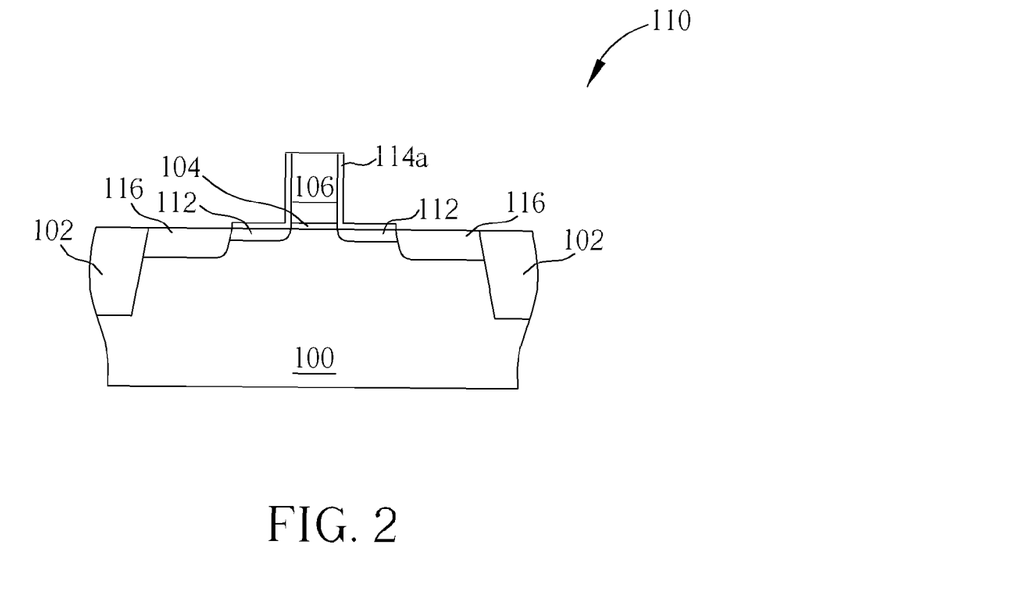

Please refer to FIG. 2. Then, a proper etchant is used to remove the SiN layer 114c and the SiO layer 114b, sequentially. It is noteworthy that during removing the SiO layer 114b, the SiN seal layer 114a serves as an etch stop layer. Therefore the profile of the sidewalls of the dummy gate 106 is impervious to the etchant. Additionally, the patterned hard mask 108 on the dummy gate 106 is simultaneously removed according to the preferred embodiment. Consequently, a top of the dummy gate 106 is exposed.

Figure 3:
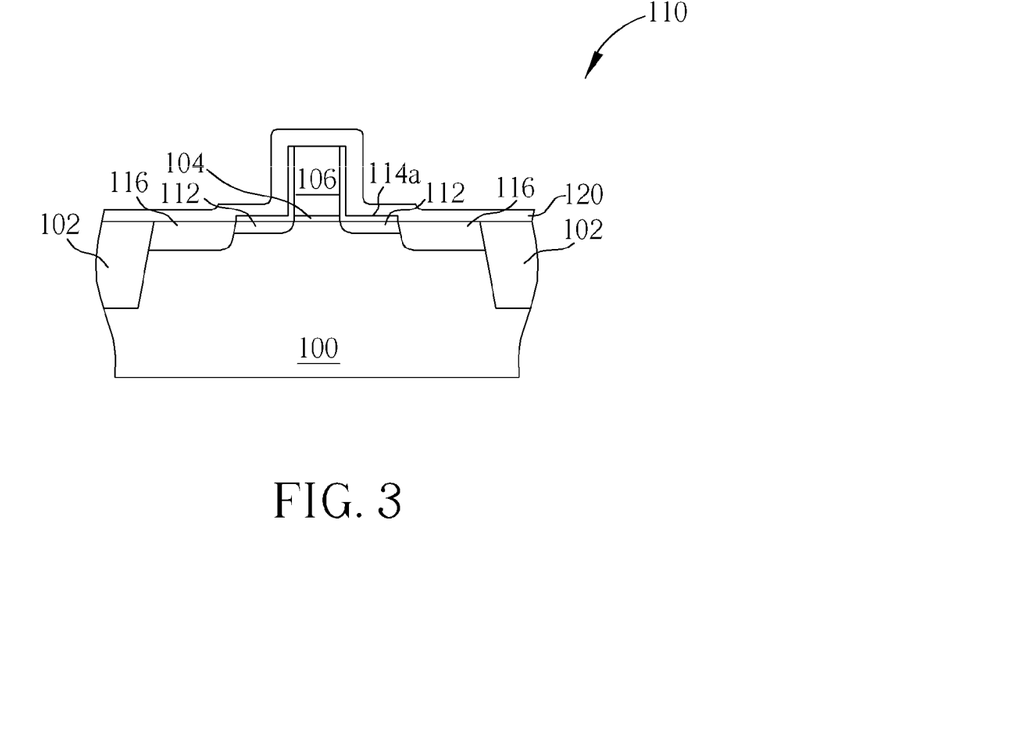

Please refer to FIG. 3. Thereafter, a sacrificial layer 120 is formed on the substrate 100. The sacrificial layer 120 covers the source/drain 116, the sidewalls of the dummy gate 106, and the SiN seal layer 114a. In the preferred embodiment, the sacrificial layer 120 includes a strain stress layer, a contact etch stop layer (CESL), or a CESL capable of providing strain stress.

Figure 4:
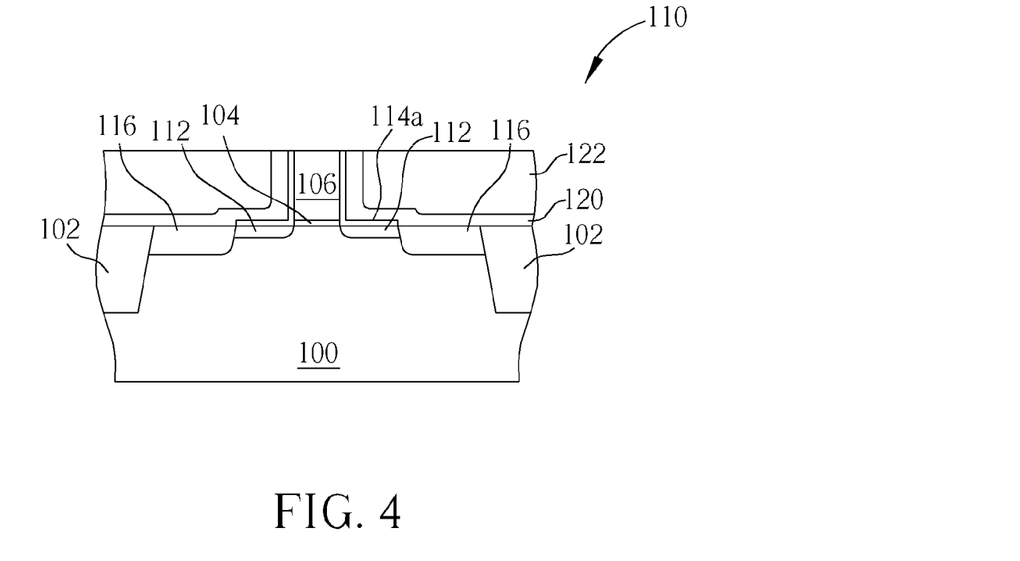

Please refer to FIG. 4. After forming the sacrificial layer 120, a dielectric layer 122 such as an inter-layer dielectric (ILD) layer is formed on the substrate 100. It is noteworthy that an etching rate of the dielectric layer 122 is different from an etching rate of the sacrificial layer 120. For example, the sacrificial layer 120 includes SiN and the dielectric layer 122 includes SiO, which is conventionally used to form the ILD layer. After forming the dielectric layer 122, a planarization process is performed to remove a portion of the dielectric layer 122 and the sacrificial layer 120. Consequently, the dielectric layer 122 and the sacrificial layer 120 on the top of the dummy gate 106 are removed, and thus the top of the dummy gate 106 is exposed.

Figure 5:
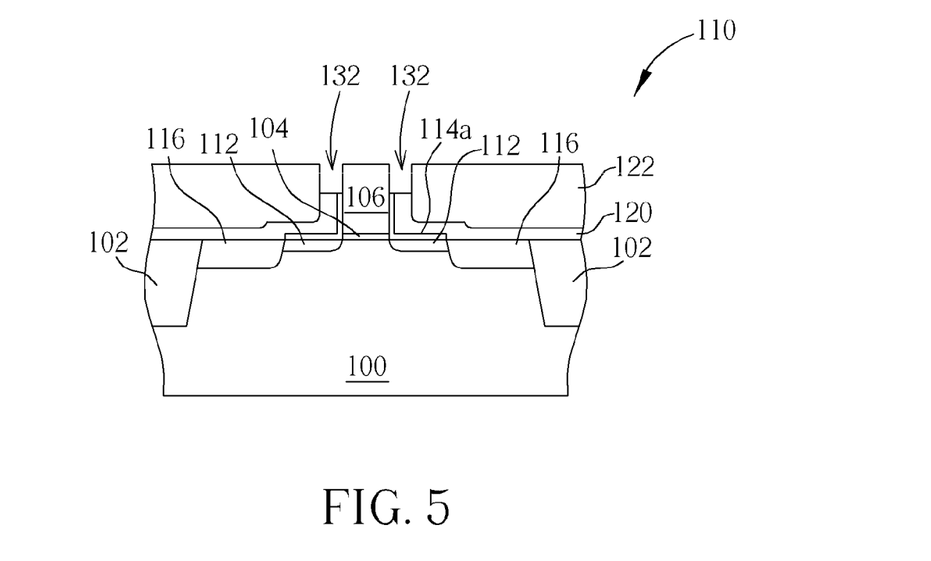

Please refer to FIG. 5. Then, a first etching process is performed to remove a portion of the sacrificial layer 120 and the SiN seal layer 104a surrounding the top of the dummy gate 106. Accordingly, at least a first recess 132 surrounding the top of the dummy gate 106 is formed. The first recess 132 includes a depth, and the depth has a preferable range of 50-250 angstroms. It is noteworthy that because the sacrificial layer 120 and the SiN seal layer 114a include SiN, the dummy gate 106 includes polysilicon and the dielectric layer 122 includes SiO, etchant having higher etching rate to SiN is chosen to remove the sacrificial layer 120 and the SiN seal layer 114a. And thus the profile of the sidewalls of the dummy gate 106 is still impervious to the etchant. After the first etching process, the sacrificial layer 120 is exposed in a bottom of the first recess 132, and the dummy gate 106 and the dielectric layer 122 form sidewalls of the first recess 132 as shown in FIG. 5. Furthermore, an opening width of the first recess 132 is substantially equal to a sum of a thickness of the sacrificial layer 120 and a thickness of the SiN seal layer 114a.

Figure 6A:
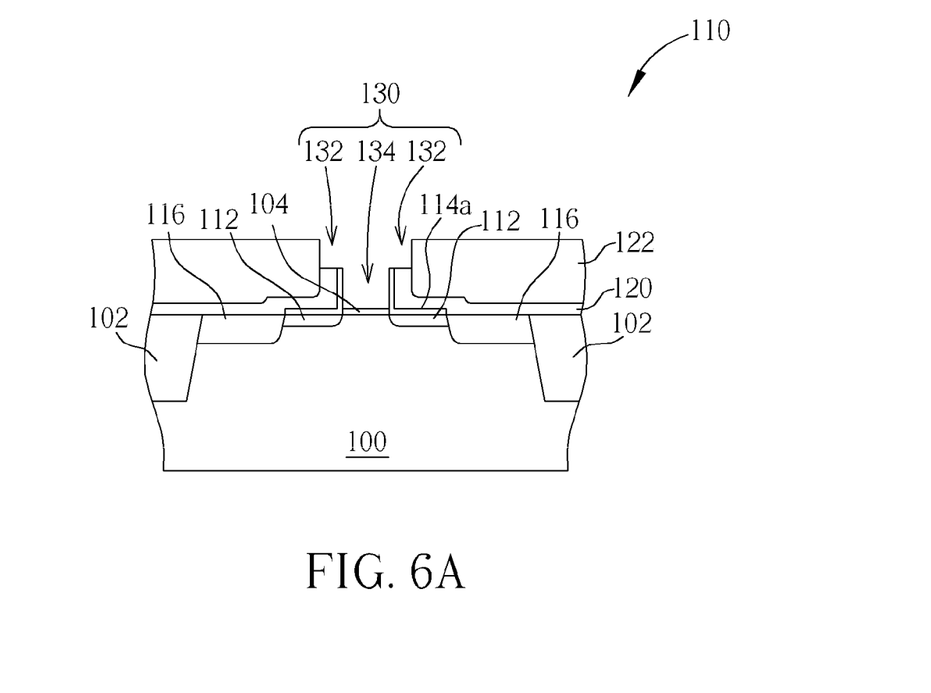
FIG. 6A is a schematic drawing in a step subsequent to FIG. 5.

Please refer to FIG. 6A. After the first etching process, a second etching process is performed to remove the dummy gate 106 to form a second recess 134 between the first recess 132. As shown in FIG. 6A, the first recess 132 and the second recess 134 form a T-shaped gate trench 130, and the gate dielectric layer 104 is exposed in a bottom of the second recess 134. It is noteworthy that an opening width of the second recess 134 is equal to a line width of the dummy gate 106, and an opening width of the T-shaped gate trench 130 is a sum of the opening width of the first recess 132 and the opening width of the second recess 134. Specifically, the opening width of the T-shaped gate trench 130 is substantially a sum of the double of the thickness of the sacrificial layer 120 and of the SiN seal layer 114a and the line width of the dummy gate 106. Therefore, the T-shaped gate trench 130 provided by the preferred embodiment includes a larger opening width.

Figure 6B:
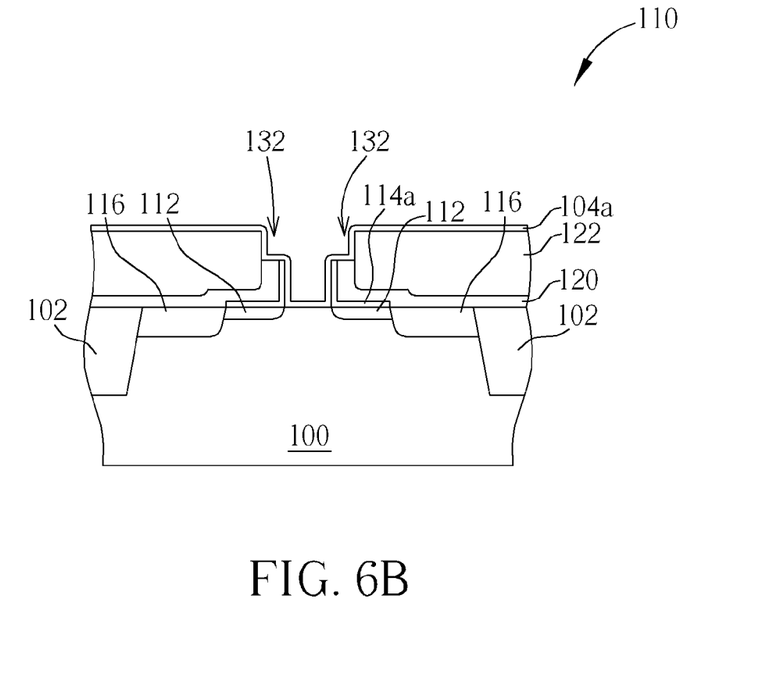
FIG. 6B is a schematic drawing illustrating a modification to the first preferred embodiment.

Please refer to FIG. 6B, which is a schematic drawing illustrating a modification to the first preferred embodiment. According to the modification, a high-K last process is integrated into the preferred embodiment. In this approach, the gate dielectric layer 104 is a conventional SiO layer and is removed from the bottom of the second recess 134 after forming the T-shaped gate trench 130. Subsequently, a high-K gate dielectric layer 104a is formed to cover sidewalls and bottom of the T-shaped gate trench 130, which is the bottom of second recess 134 as shown in FIG. 6B.

Figure 7:
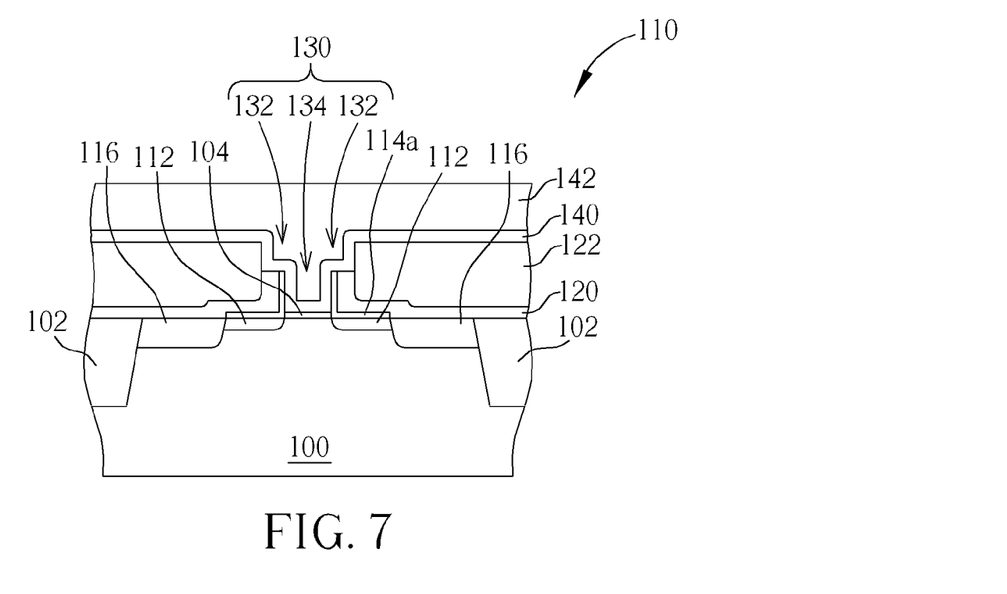

Please refer to FIG. 7. After forming the T-shaped gate trench 130, a work function metal layer 140 and a filling metal layer 142 are sequentially formed in the T-shaped gate trench 130. When the semiconductor device 110 provided by the preferred embodiment is a p-type transistor, the work function metal layer 140 includes materials having a work function between about 4.8 eV and about 5.2 eV; and when the semiconductor device 110 is an n-type transistor, the work function metal layer 140 includes materials having work function between about 3.9 eV and about 4.3 eV. The work function metal layer 140 and the filling metal layer 142 can be a single-layered or multi-layered metal layer. The filling layer 142 has superior gap-filling characteristic. Additionally, a barrier layer (not shown) is selectively formed in the T-shaped gate trench 130 before forming the work function metal layer 140. Because processes and material choices for the barrier layer, the work function metal layer 140 and the filling metal layer 142 are well-known to those skilled in the art, those details are omitted in the interest of brevity. More important, since the T-shaped gate trench 130 provided by the preferred embodiment includes the larger opening width, the work function metal layer 140 and the filling metal layer 142 are easily formed in the T-shaped gate trench 130.

Figure 8:
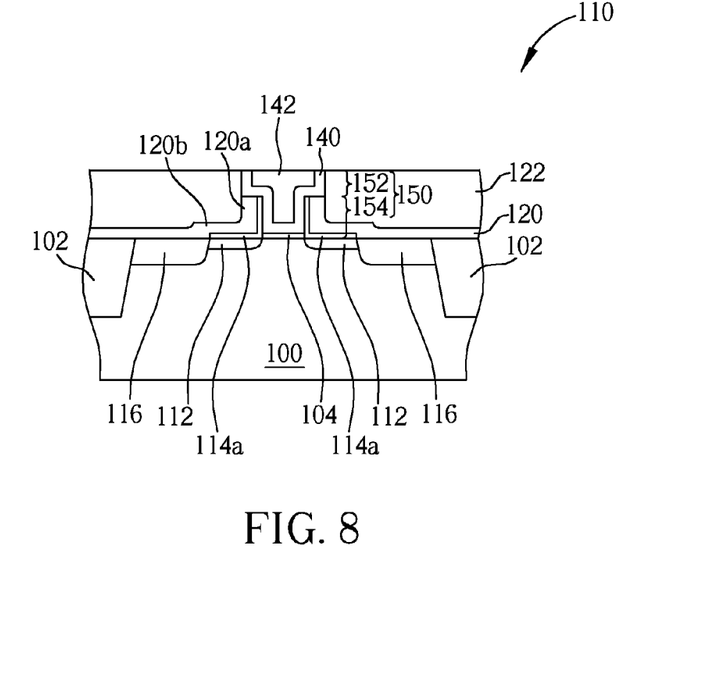

Please refer to FIG. 8. Then, a planarization process is performed to remove the unnecessary work function layer 140 and the filling metal layer 142 from the substrate 100. Consequently, a substantially even surface of the substrate 100 is obtained, and a T-shaped metal gate 150 is formed in the T-shaped gate trench 130. In another modification to the preferred embodiment, a head portion 152 of the T-shaped metal gate 150 can be removed by the planarization process. Additionally, the dielectric layer 122 can be removed, even the sacrificial layer 120 can be removed after forming the T-shaped metal gate 150 and followed by forming another CESL (not shown) for providing strain stress and another ILD layer (not shown) on the substrate 100.

Please still refer to FIG. 8. According to the preferred embodiment, the semiconductor device 110 having a metal gate is provided. The provided semiconductor device 110 includes the substrate 100, the high-K gate dielectric layer 104/104a formed on the substrate 100, the T-shaped metal gate 150 formed on the substrate 100, and a L-shaped sacrificial layer 120 under the T-shaped metal gate 150. According to the preferred embodiment, the L-shaped sacrificial layer 120 includes a strain stress layer or a CESL. The semiconductor device 110 further includes the LDDs 112 and the source/drain 116 formed in the substrate 100 at the two sides of the T-shaped metal gate 150. As shown in FIG. 8, the T-shaped metal gate 150 further includes a head portion 152 and a body portion 154 formed under the head portion 152 for supporting the head portion 152. The T-shaped metal gate 150 is a multi-layered structure and includes the work function metal layer 140 and the filling metal layer 142 as mentioned above. As shown in FIG. 8, the L-shaped sacrificial layer 120 includes an erection portion 120a and an extension portion 120b. The erection portion 120a is formed under the head portion 152 of the T-shaped metal gate 150 and perpendicular to the substrate 100. The extension portion 120b is formed parallel with the substrate 100 and covering at least the LDDs 112 and the source/drain 116.

According to the first preferred embodiment, the first etching process and the second etching process are sequentially performed to respectively remove the portion of the sacrificial layer (the portion of the CESL 120) and the dummy gate 106. Consequently, a T-shaped gate trench 130 is obtained. The opening width of the T-shaped gate trench 130 is the sum of the double of the thickness of the sacrificial layer 120 and of the SiN seal layer 114a and the line width of the dummy gate 106. In other words, preferred embodiment provides a T-shaped gate trench 130 having lower aspect ratio. Therefore the work function metal layer 140 and the filling metal layer 142 are easily formed in the T-shaped gate trench 130 without forming any seam in the T-shaped gate trench 130, and thus the reliability of the T-shaped metal gate 150 is improved.

Figure 9:
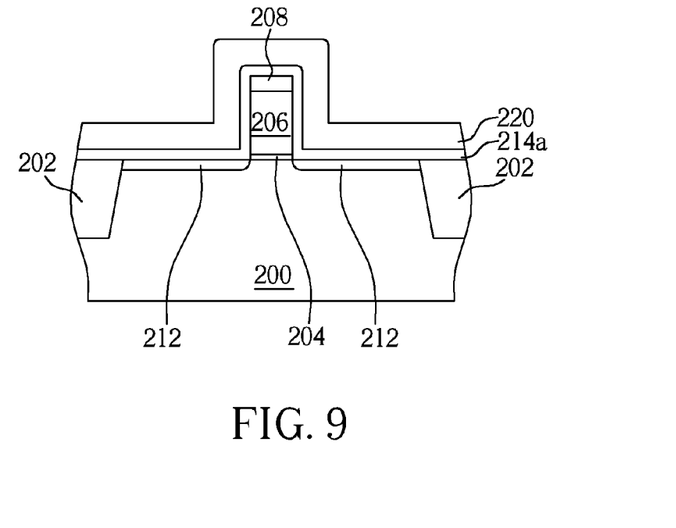
FIGS. 9-15 are schematic drawings illustrating a method of manufacturing a semiconductor device having metal gate provided by a second preferred embodiment of the present invention.

Please refer to FIGS. 9-15, which are schematic drawings illustrating a method of manufacturing a semiconductor device having metal gate provided by a second preferred embodiment of the present invention. It is noteworthy that in the second preferred embodiment, material choice of the elements and steps for forming the elements that are the same with the first preferred embodiment are omitted for the sake of simplicity. As shown in FIG. 9, a substrate 200 having a plurality of STI 202 for providing electrical isolation formed therein is provided. Subsequently, at least a gate structure is formed on the substrate 100. The gate structure includes a gate dielectric layer 204, a dummy gate 206 and a patterned hard mask 208.

Please still refer to FIG. 9. After forming the dummy gate 206, ion implantation is performed to form LDDs 212 in the substrate 200 at two sides of the dummy gate 206. Subsequently, a SiO layer 214a and a sacrificial layer 220 is formed on the substrate 200. According to the preferred embodiment, the sacrificial layer 220 includes materials having etching rate distinctly different from the SiO layer 214a, the sacrificial layer 220 exemplarily includes SiN.

Figure 10:
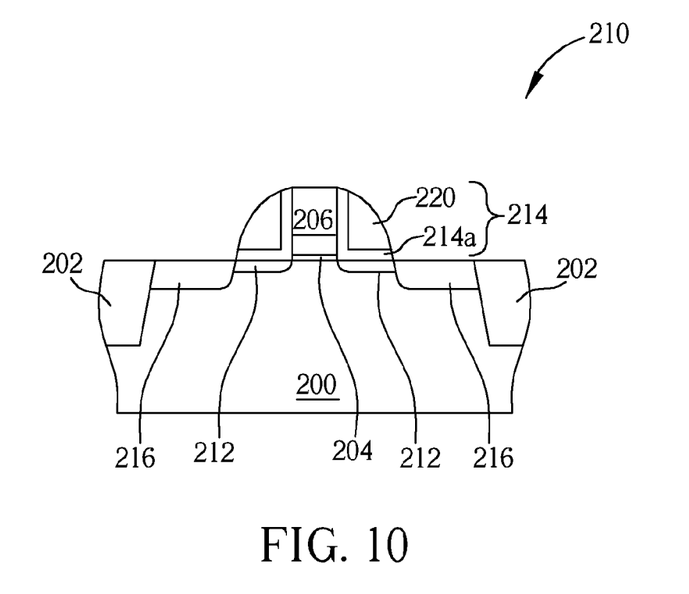

Please refer to FIG. 10. After forming the sacrificial layer 220, an etching back process is performed to etch back the sacrificial layer 220 and the SiO layer 214a to form a spacer 214 on sidewalls of the dummy gate 206. In the preferred embodiment, the patterned hard mask 208 on a top of the dummy gate 206 is simultaneously removed. Therefore the top of the dummy gate 206 is exposed after the etching back process. After forming the spacer 214, another ion implantation is performed to form a source/drain 216 in the substrate 200 at two sides of the spacer 214. According to the preferred embodiment, the sacrificial layer 220 is a part of the spacer 214, therefore the sacrificial layer 220 never covers the source/drain 216. As mentioned above, the SEG method can be utilized to form the source/drain 216, and silicide (not shown) for reducing the contact resistance is formed on the source/drain 216. Consequently, a semiconductor device 210 is obtained.

Figure 11:
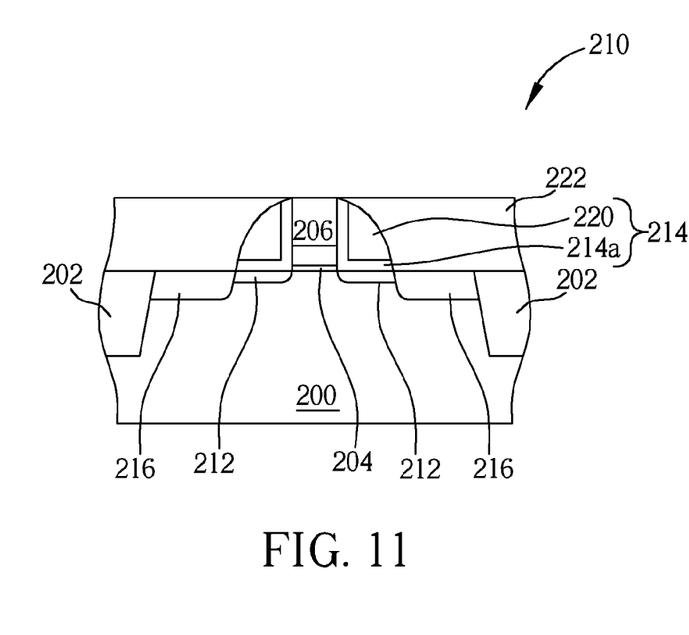

Please refer to FIG. 11. After forming the source/drain 216 and the silicides, a dielectric layer 222 such as an ILD layer including SiO is formed on the substrate 200. And a planarization process is subsequently performed to remove a portion of the dielectric layer 222 to form a substantially even surface of the substrate 200 and expose the top of the dummy gate 206.

Figure 12:
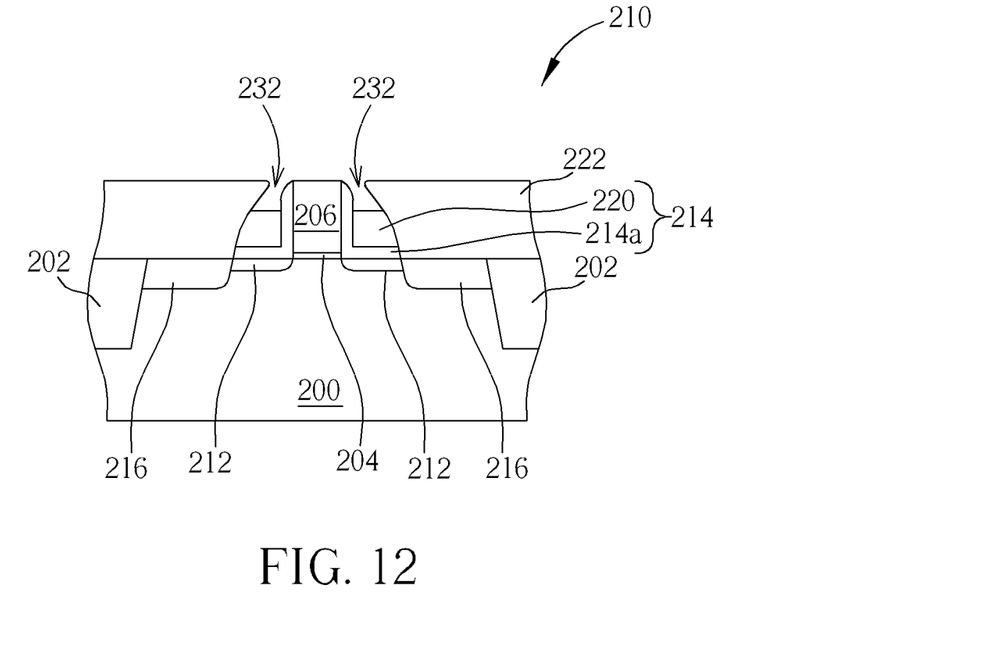

Please refer to FIG. 12. Then, a first etching process is performed to remove a portion of the sacrificial layer 220 surrounding the top of the dummy gate 206. Accordingly, at least a first recess 232 is formed surrounding the top of the dummy gate 206. The first recess 232 includes a depth, and the depth has a preferable range of 50-250 angstroms. It is noteworthy that because the sacrificial layer 220 includes SiN while the dielectric layer 222 includes SiO, etchant having higher etching rate to SiN is chosen to remove the sacrificial layer 220. And thus the profile of the sidewalls of the dummy gate 206 is impervious to the etchant. After the first etching process, the sacrificial layer 220 is exposed in a bottom of the first recess 232, and the dummy gate 206 and the dielectric layer 222 form sidewalls of the first recess 232 as shown in FIG. 12. Furthermore, an opening width of the first recess 232 is substantially equal to a thickness of the sacrificial layer 220.

Figure 13:
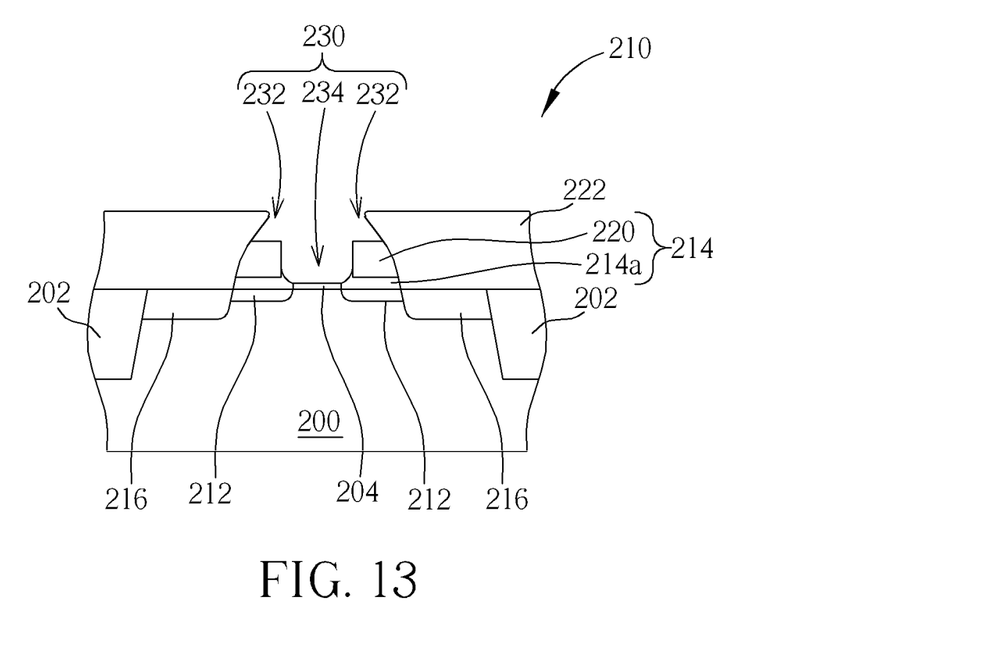

Please refer to FIG. 13. After the first etching process, a second etching process is performed to remove the dummy gate 206 and the SiO layer 214a to form a second recess 234 between the first recesses 232. As shown in FIG. 13, the first recess 232 and the second recess 234 form a T-shaped gate trench 230, and the gate dielectric layer 204 is exposed in a bottom of the second recess 234. It is noteworthy that an opening width of the second recess 234 is equal to a line width of the dummy gate 206, and an opening width of the T-shaped gate trench 230 is a sum of the double of the opening width of the first recess 232 and the opening width of the second recess 234. Specifically, the opening width of the T-shaped gate trench 230 is substantially a sum of the double of the thickness of the sacrificial layer 220 and the line width of the dummy gate 206. Therefore, the T-shaped gate trench 230 provided by the preferred embodiment includes a larger opening width.

Figure 14:
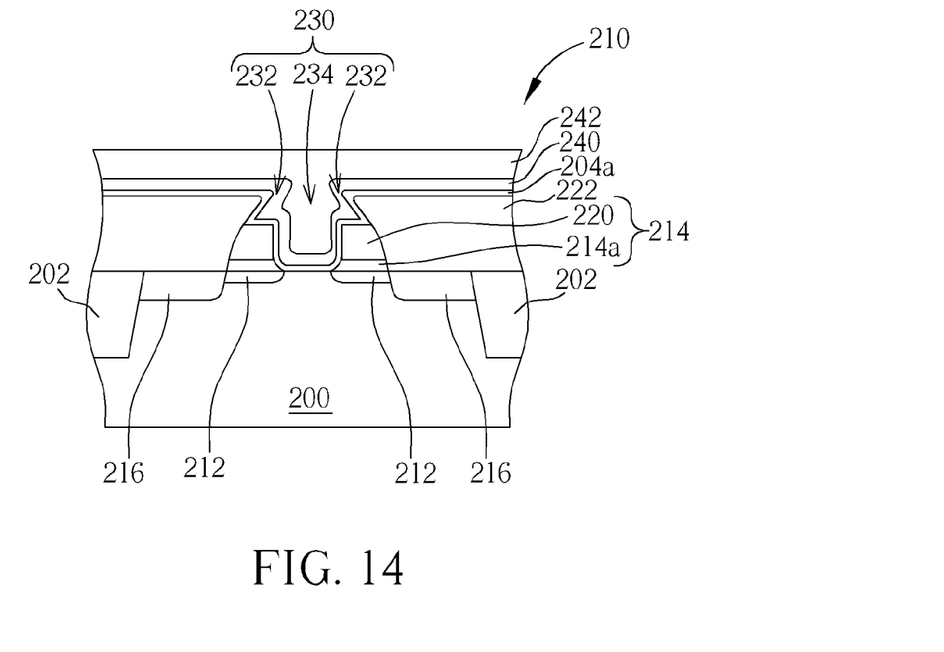

Please refer to FIG. 14. In the preferred embodiment, a high-K process is integrated into the method. Accordingly, the gate dielectric layer 204 is removed from the second recess 234 after forming the T-shaped gate trench 230. Then, a high-K gate dielectric layer 204a, a work function metal layer 240, a filling metal layer 242 are sequentially formed in the T-shaped gate trench 230. When the semiconductor device 210 provided by the preferred embodiment is a p-type transistor, the work function metal layer 240 includes materials having a work function between about 4.8 eV and about 5.2 eV; and when the semiconductor device 210 is an n-type transistor, the work function metal layer 240 includes materials having work function between about 3.9 eV and about 4.3 eV. The work function metal layer 240 and the filling metal layer 242 can be a single-layered or multi-layered metal layer. And the filling metal layer 242 includes superior gap-filling characteristic. Additionally, a barrier layer (not shown) is selectively formed in the T-shaped gate trench 230 before forming the work function metal layer 240. Because processes and material choices for the barrier layer, the work function metal layer 240 and the filling metal layer 242 are well-known to those skilled in the art, those details are omitted in the interest of brevity. More important, since the T-shaped gate trench 230 provided by the preferred embodiment includes the larger opening width, the work function metal layer 240 and the filling metal layer 242 are easily formed in the T-shaped gate trench 230.

Figure 15:
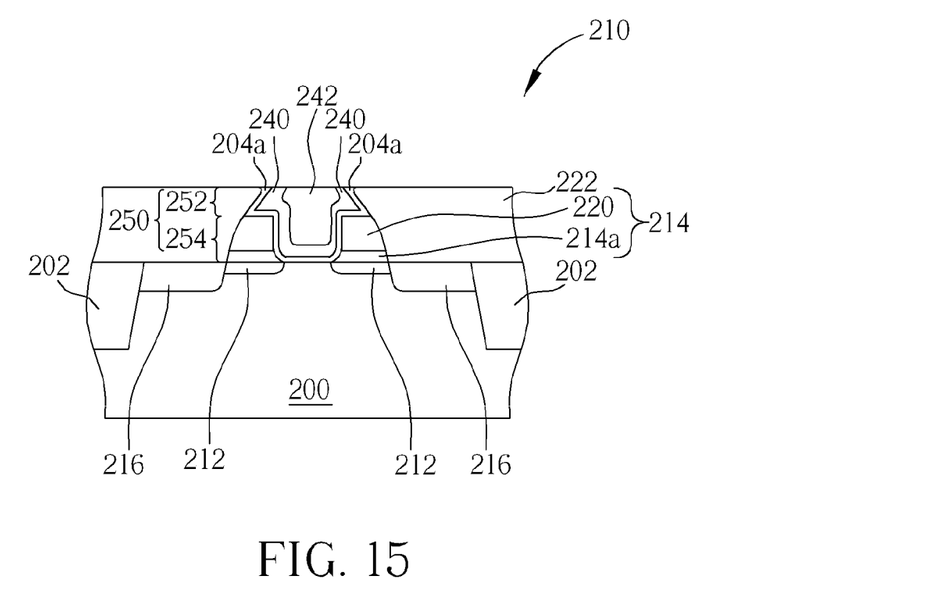

Please refer to FIG. 15. Then, a planarization process is performed to remove the unnecessary high-K gate dielectric layer 204a, work function layer 240 and filling metal layer 242 from the substrate 200. Consequently, a substantially even surface of the substrate 200 is obtained, and a T-shaped metal gate 250 is formed in the T-shaped gate trench 230. In another modification to the preferred embodiment, a head portion 252 of the T-shaped metal gate 250 can be removed by the planarization process. Additionally, the dielectric layer 222 can be removed after forming the T-shaped metal gate 250 and followed by forming another CESL (not shown) for providing strain stress and another ILD layer (not shown) on the substrate 200.

Please still refer to FIG. 15. According to the preferred embodiment, the semiconductor device 210 having a metal gate is provided. The provided semiconductor device 210 includes the substrate 200, the high-K gate dielectric layer 204a formed on the substrate 200, the T-shaped metal gate 250 formed on the substrate 200, and a sacrificial layer 220 under the T-shaped metal gate 250. According to the preferred embodiment, the sacrificial layer 220 includes the spacer 214. The semiconductor device 210 further includes the LDDs 212 and the source/drain 216 formed in the substrate 200 at the two sides of the T-shaped metal gate 250. As shown in FIG. 15, the T-shaped metal gate 250 further includes a head portion 252 and a body portion 254 formed under the head portion 252 for supporting the head portion 252. The T-shaped metal gate 250 is a multi-layered structure and includes the work function metal layer 240 and the filling metal layer 242 as mentioned above. As shown in FIG. 15, the sacrificial layer 220 serving as a part of the spacer 215 is formed under the head portion 252 of the T-shaped metal gate 250 and not covering the source/drain 216.

According to the second preferred embodiment, the first etching process and the second etching process are sequentially performed to respectively remove the portion of the sacrificial layer 220 (the portion of the spacer 214) and the dummy gate 206. Consequently, a T-shaped gate trench 230 is obtained. The opening width of the T-shaped gate trench 230 is the sum of the double of the thickness of the sacrificial layer 220 and the line width of the dummy gate 206. In other words, preferred embodiment provides a T-shaped gate trench 230 having lower aspect ratio. Therefore the work function metal layer 240 and the filling metal layer 242 are easily formed in the T-shaped gate trench 230 without forming any seam in the T-shaped gate trench 230, and thus the reliability of the T-shaped metal gate 250 is improved.

According to the semiconductor device having a metal gate and the method of manufacturing a semiconductor device having metal gate provided by the present invention, the T-shaped gate trench constructed by the first recess and the second recess is obtained by performing two etching processes. According to the present invention, the T-shaped gate trench includes a larger opening width, thus the metal layers are easily formed in the trench gate. Consequently, the semiconductor device having metal gate provided by the present invention has the advantage of superior gap-filling result and improved reliability.

Those skilled in the art will readily observe that numerous modifications and alterations of the device and method may be made while retaining the teachings of the invention.

What is claimed is:

1. A semiconductor device having metal gate, comprising:
a substrate;
a high-K gate dielectric layer;
a T-shaped metal gate comprising:
a head portion; and
a body portion formed under the head portion for supporting the head portion;
a source/drain positioned in the substrate at two sides of the T-shaped metal gate;
lightly-doped drains respectively formed in the substrate at two sides of the T-shaped metal gate; and
a sacrificial layer formed at two sides of the T-shaped metal gate and at least formed under the head portion of the T-shaped metal gate, wherein the sacrificial layer covers the source/drain entirely, the sacrificial layer overlaps with the lightly-doped drains entirely but not physically contacts the lightly-doped drains.

2. The semiconductor device according to claim 1, wherein the T-shaped metal gate further comprising a work function metal layer and a filling metal layer.

3. The semiconductor device according to claim 1, wherein the sacrificial layer comprising an L-shaped sacrificial layer, and the L-shaped sacrificial layer further comprising:
an erection portion formed under the head portion of the T-shaped metal gate and perpendicular to the substrate; and
an extension portion formed on the substrate and parallel with the substrate.

4. The semiconductor device according to claim 3, wherein the extension portion covers the source/drain entirely.

5. The semiconductor device according to claim 3, wherein the L-shaped sacrificial layer comprises a strain stress layer or a contact etch stop layer (CESL).

6. A semiconductor device having metal gate, comprising:
a substrate;
a high-K gate dielectric layer;
a T-shaped metal gate comprising:
a head portion, wherein sidewalls of the head portion of the T-shaped metal gate is covered by the high-k gate dielectric layer; and
a body portion formed under the head portion for supporting the head portion;
a source/drain positioned in the substrate at two sides of the T-shaped metal gate; and
a sacrificial layer formed at two sides of the T-shaped metal gate and at least formed under the head portion of the T-shaped metal gate, wherein the sacrificial layer is formed not covering the source/drain.

7. The semiconductor device according to claim 6, wherein the sacrificial layer comprises a spacer.

* * * * *